(12) United States Patent
Jin et al.

(10) Patent No.: US 7,127,223 B2
(45) Date of Patent: Oct. 24, 2006

(54) PROACTIVE GAIN CONTROL SYSTEM FOR COMMUNICATIONS RECEIVERS

(75) Inventors: Hang Jin, Plano, TX (US); John Grabner, Plano, TX (US); Jun Huang, Columbus, OH (US); Daniel Wee Teck Ho, Garland, TX (US)

(73) Assignee: Navini Networks, Inc., Richardson, TX (US)

( * ) Notice: Subject to any disclaimer, the term of this patent is extended or adjusted under 35 U.S.C. 154(b) by 0 days.

(21) Appl. No.: 11/189,941

(22) Filed: Jul. 26, 2005

(65) Prior Publication Data
US 2006/0052070 A1   Mar. 9, 2006

Related U.S. Application Data

(60) Provisional application No. 60/608,441, filed on Sep. 9, 2004.

(51) Int. Cl.
*H04B 1/06* (2006.01)
(52) U.S. Cl. .................. 455/232.1; 455/234.1; 375/345
(58) Field of Classification Search ............. 455/67.11, 455/226.1, 226.2, 231.1, 234.1, 245.1, 250.1; 375/345
See application file for complete search history.

(56) References Cited

U.S. PATENT DOCUMENTS

| 6,002,723 | A   | * | 12/1999 | Chethik ................... 375/345 |
| 6,633,200 | B1  | * | 10/2003 | Kolanek ................... 330/149 |
| 6,735,423 | B1  | * | 5/2004  | Uskali et al. ............ 455/232.1 |

* cited by examiner

*Primary Examiner*—Quochien B. Vuong
(74) *Attorney, Agent, or Firm*—Preston Gates & Ellis LLP

(57) ABSTRACT

The present invention discloses a proactive gain control system for a communications receiver. The proactive gain control system includes a variable gain module for outputting an output signal in response to an input signal. A detector detects the output signal and outputs a detection signal representing a signal strength of the output signal. A traffic monitor monitors the output signal and outputs a traffic profile signal indicating that a traffic profile for the input signal will change. A gain computing module outputs a gain adjustment value in response to the detection signal and the traffic profile signal. A gain control module outputs a gain control signal to the variable gain module, which determines a gain between the input and output signals, in response to the gain adjustment value.

26 Claims, 5 Drawing Sheets

PROACTIVE GAIN CONTROL SYSTEM FOR COMMUNICATIONS RECEIVERS

BACKGROUND

The present application claims the benefits of U.S. Provisional Patent Application Ser. No. 60/608,441, which was filed on Sep. 9, 2004 and entitled "Proactive Gain Controller for Receiver."

BACKGROUND

The present invention relates generally to communications receivers, and more particularly to a proactive gain control system for communications receivers.

A gain control system is typically used to control an input signal level of a communication receiver. Environmental changes can change the input signal level. For example, in a cellular communications system, the input signal level may change by 20 dB within a few milliseconds due to a movement of mobile units or a channel fading. A change of a traffic profile can also drastically change the input signal level. This traffic profile includes the data traffic attributes, such as a modulation type of the input signal, a number of traffic channels for the input signal, a coding scheme of the input signal and a data transfer rate of the input signal. The change of the signal level caused by the environmental changes is relatively gradual as opposed to those caused by the traffic profile changes.

A communications receiver has a limited dynamic range for receiving input signals. A change of the input signal level caused by the environmental changes or the traffic profile changes can go beyond the limited dynamic range of the communications receiver. Thus, most of the communication receivers have some sort of gain control systems. One purpose of the gain control system is to reduce the receiver gain when the input signal level is too high, and to increase the receiver gain when the input signal level is too low. Thus, the input signal can be maintained at an optimal level within the dynamic range of the receiver.

There are many conventional automatic gain control (AGC) circuits in use today. Most of these AGC circuits are the reactive type of gain controllers. They typically include a signal strength detector to detect the currently received signal level, a comparator that compares the received signal level to a threshold level, and a control circuit that adjusts the receiver gain to reduce a signal error generated by the comparator. These reactive AGC circuits use a kind of feel-first-and-then-react approach. However, the reactive AGC circuits do not cope well with a drastic change of the input signal caused by the traffic profile changes.

Therefore, desirable in the art of gain control systems for communications receivers are circuit designs that provide a proactive receiver gain control scheme taking into account a drastic change of the input signal caused by traffic profile changes.

SUMMARY

The present invention discloses a proactive gain control system for a communications receiver. In one embodiment of the present invention, the proactive gain control system includes a variable gain module for outputting an output signal in response to an input signal. A detector detects the output signal and outputs a detection signal representing a signal strength of the output signal. A traffic monitor monitors the output signal and outputs a traffic profile signal indicating that a traffic profile for the input signal will change. A gain computing module outputs a gain adjustment value in response to the detection signal and the traffic profile signal. A gain control module outputs a gain control signal to the variable gain module, which determines a gain between the input and output signals, in response to the gain adjustment value.

The construction and method of operation of the invention, however, together with additional objects and advantages thereof will be best understood from the following description of specific embodiments when read in connection with the accompanying drawings.

DESCRIPTION

Figure 1:
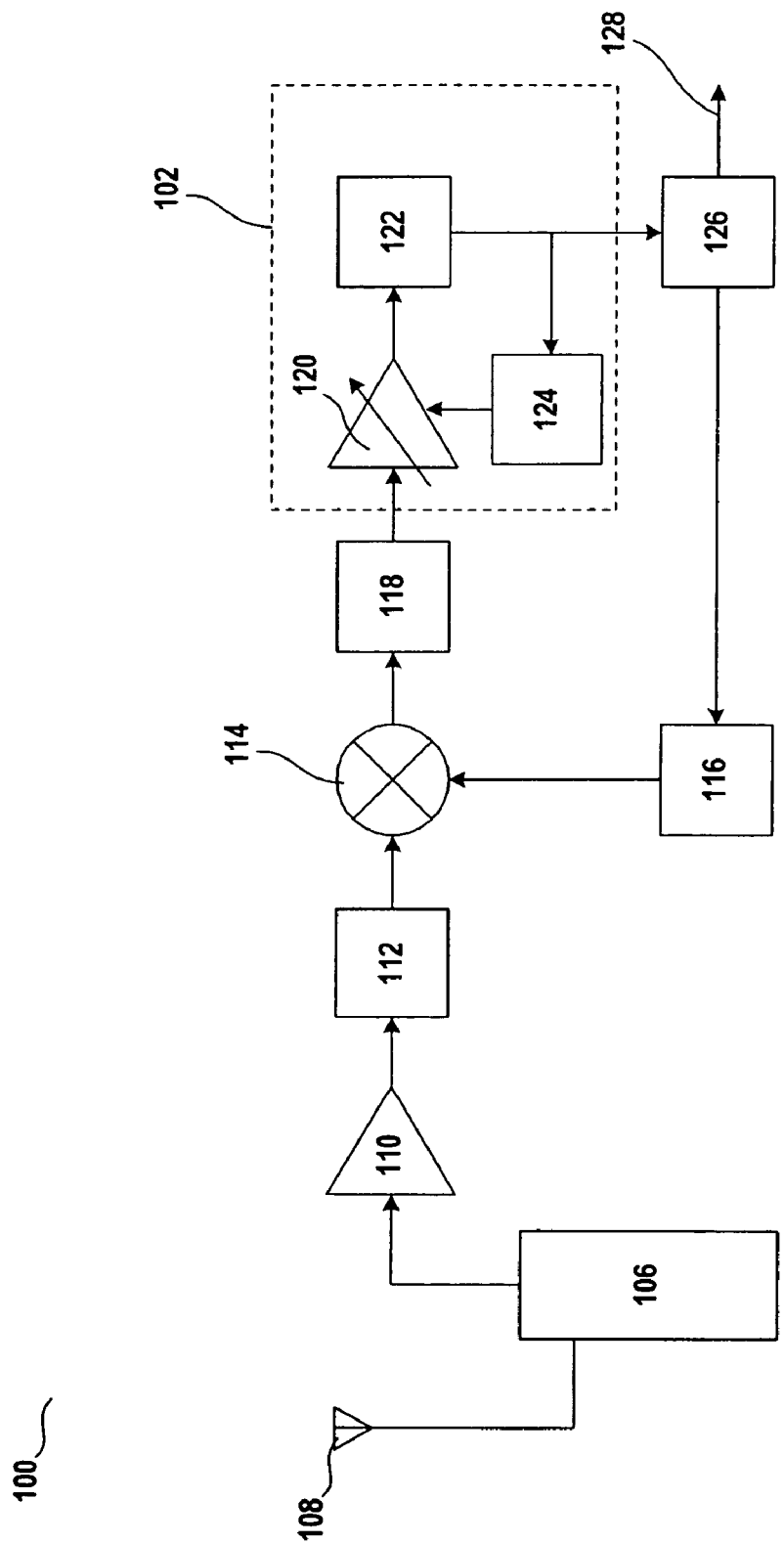
FIG. 1 presents a communications receiver with a conventional reactive type of gain control system.

FIG. 1 presents a block diagram of a conventional communications receiver 100 with an AGC circuit 102 for controlling the signal gain of the receiver. An antenna 108 receives a radiated radio frequency (RF) signal, which is routed through a duplexer module 106 to a low noise amplifier 110. The low noise amplifier 110 amplifies and filters the RF signal, which is filtered further by a RF filter 112. The RF signal is converted to an intermediate frequency (IF) by heterodyne mixing in a mixer 114 with a local oscillator signal generated by a programmable synthesizer 116. The IF frequency is then filtered by a bandpass filter 118 to restrict the signal bandwidth approximately to one radio channel. The signal is then fed to the AGC circuit 102 to adjust the amplification of the input signal for maintaining the signal within the receiver's dynamic range. The AGC circuit 102 includes a variable gain module 120, an analog-to-digital converter (ADC) 122, and a feedback circuitry 124 that controls the variable gain module 120. The signal output from the ADC 122 is fed to the feedback circuitry 124 and a baseband signal processor 126. The baseband signal processor 126 controls the programmable synthesizer 116 and also outputs the decoded data 128 for further processing.

The AGC circuit 102, which uses a reactive type of gain control scheme, does not cope well with a drastic change of the input signal caused by traffic profile changes. Thus, it is desired to have a gain control scheme for a communications receiver that takes into account the change of the traffic profile.

Figure 2:
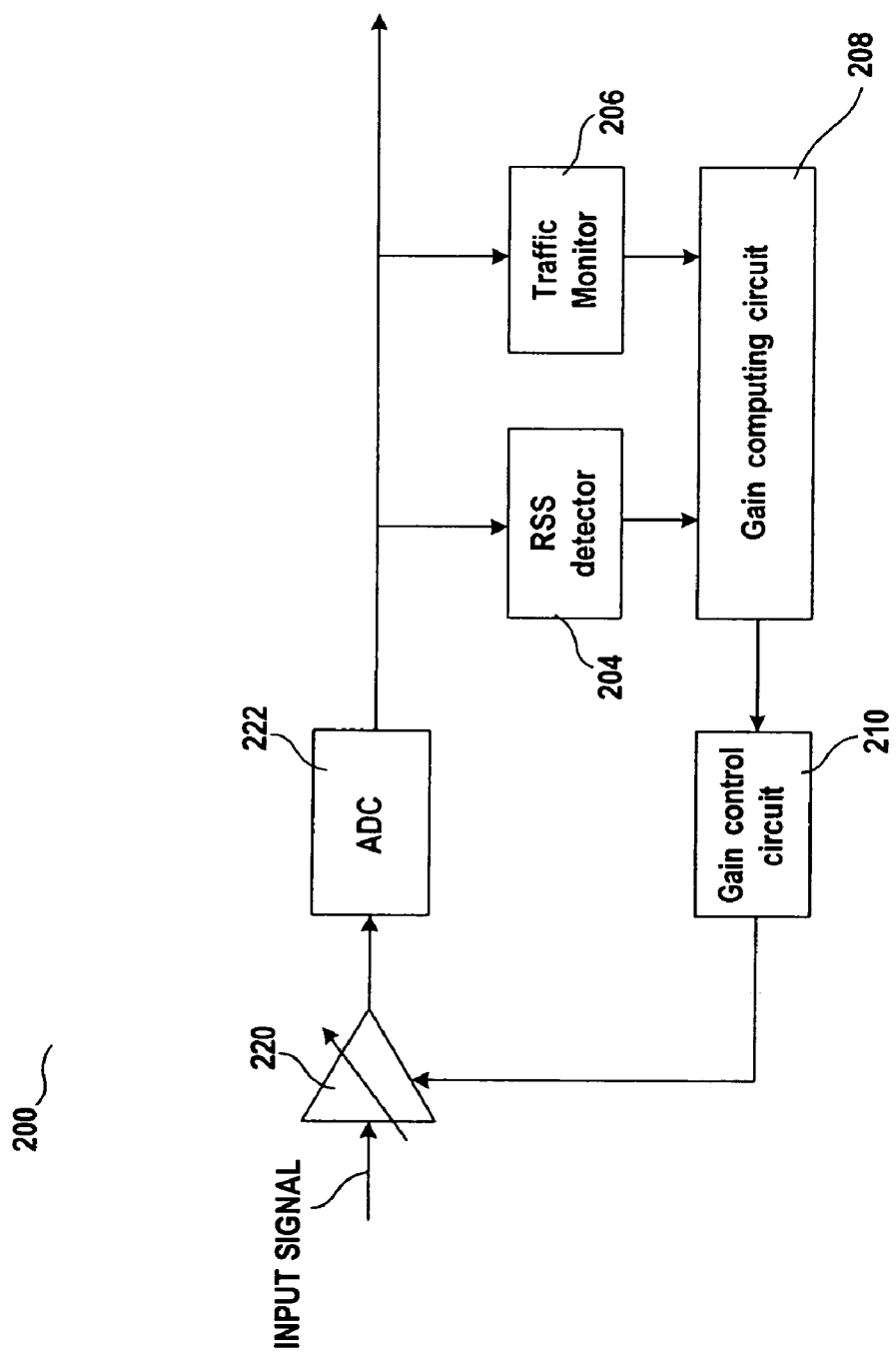
FIG. 2 presents a proactive gain control system for a communications receiver in accordance with one embodiment of the present invention.

FIG. 2 presents a proactive gain control system 200 in accordance with one embodiment of the present invention. The proactive gain control system 200 includes a variable gain module 220 and an ADC 222. An input signal is received by the variable gain module 220. An output signal is output from the variable gain module 220 to the ADC 222 for converting from an analog format into a digital format. The output signal from the ADC 222 is sent to a receiver signal strength (RSS) detector 204, which detects the real time instantaneous signal level of the output signal. A traffic monitor 206 monitors the output signal and outputs a traffic profile signal indicating when and how a traffic profile for the input signal will change. This traffic profile includes the data traffic attributes, such as a modulation type of the input signal, a number of traffic channels for the input signal, a coding scheme of the input signal and a data transfer rate of the input signal. A gain computing circuit 208 outputs a gain adjustment value to a gain control circuit 210 in response to the detection signal and the traffic profile signal. The gain control circuit 210 outputs a gain control signal to the variable gain module 220, which determines a gain between input and output signals, in response to the gain adjustment value.

The traffic monitor 206 monitors when and how the traffic profile will change based on instruction data contained therein. It is understood that communications protocol is a layered structure. The lowest layer is the physical layer that handles the physical aspect of communications, such as amplification, frequency conversion, modulation, etc. Above the physical layer, there are other communication layers handling the data type definition, the data arrangement, the sender and receptor addresses, etc. The traffic monitor 206 analyzes the higher layers of the communications protocol, and monitors the conditions of the current traffic profile as well as any high layer instructions that indicate the future traffic profile. For example, in a data communications system with a dynamic modulation and channel assignment scheme, there are certain logical channels designated to send or receive the instructions about when and how the modulation and data transfer rates will be changed in the future. The traffic monitor 206 will monitor these logic channels and forward this information to the gain computing circuit 208 proactively.

The computation of the gain adjustment value by the gain computing circuit 208 depends on whether or not the traffic profile signal indicates that the traffic profile will change in a coming receiver gain updating cycle. In the first case where the traffic profile signal does not indicate that the traffic profile will change in a coming receiver gain updating cycle, the gain computing circuit 208 will output the gain adjustment value to the gain control circuit 210. In this situation, only environmental changes, such as weather, mobile movement, fading, etc., are occurring, and the variable gain module 220 adjusts the receiver gain slowly. The gain adjustment value is determined by comparing a predetermined current reference signal strength (RSS_ref) with a average signal strength (RSS_ave), which can be a root mean square (RMS) value of the detected signal strength over a predetermined window. The window must be considerably larger than the information carrying signal amplitude variation period but must be smaller than the signal variation period caused by environmental changes. The gain control circuit 210 increases the gain between the input and output signals of the receiver in response to the gain adjustment value when the RSS_ave is smaller then the predetermined current RSS_ref. The gain control circuit 210 decreases the gain between the input and output signals of the receiver in response to the gain adjustment value when the RSS_ave is larger then the predetermined current RSS_ref.

In the second case where the traffic profile signal indicates that the traffic profile will change in a coming receiver gain updating cycle, the gain computing circuit 208 will output the gain adjustment value, which takes into account a change of the traffic profile. In such case, the gain computing circuit 208 computes a prospective RSS_ref for replacing the current RSS_ref in the coming gain updating cycle. The gain adjustment value is determined by comparing the current RSS_ref with the RSS_ave, taking into account a difference between the prospective RSS_ref and the current RSS_ref. The gain adjustment value indicates the amount of the receiver gain that should be increased or decreased in the coming receiver gain updating cycle.

In the embodiment of the present invention, the gain control circuit 210 is a real time, no-delay gain setting circuit. It converts the gain adjustment value into an analog gain control signal, and applies it to the variable gain module 220. The variable gain module 220 then adjusts the receiver gain in response to the gain control signal.

Figure 3:
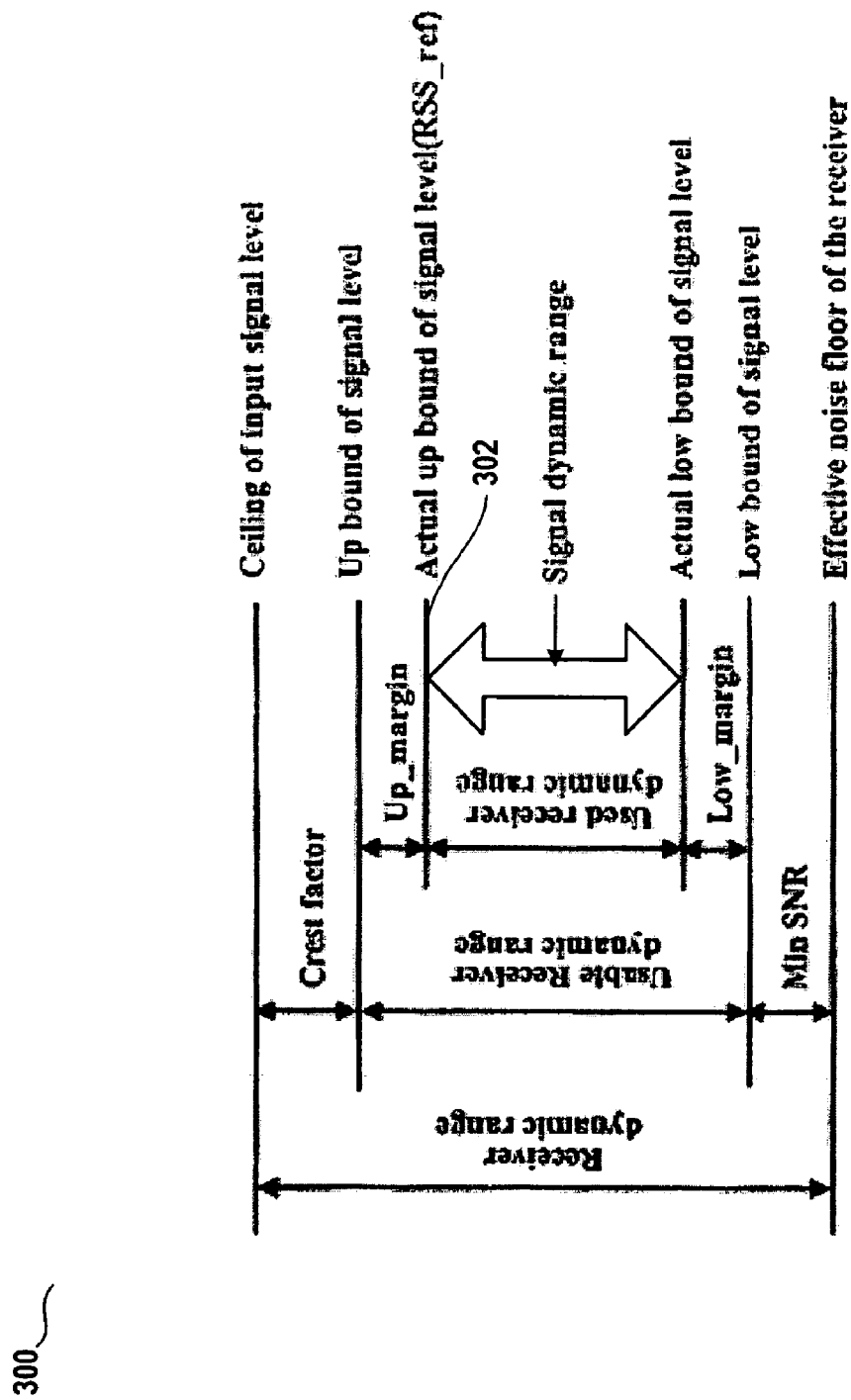
FIG. 3 presents a graph showing the dynamic ranges of the communications receiver and the input signal in accordance with another embodiment of the present invention.

FIG. 3 presents a graph 300 showing the dynamic ranges of the communications receiver and the input signal in accordance with one embodiment of the present invention. All receivers have a limited dynamic range. There is a maximum input signal level (ceiling) and a minimum input signal level (effective noise floor) for all receivers. The difference between the ceiling and the effective noise floor determines the receiver's dynamic range. The ceiling is often characterized as the maximum signal level that will not overload (exceed) the receiver's capability. The effective noise floor is seen as the noise floor that actually affects the signal quality. In the case of code division multiple access (CDMA) receivers, the effective noise floor is the ambient noise floor plus the receiver noise figure minus the CDMA spread gain: effective noise floor=−174+NF−10*log 10 (SF) dBm/Hz, where SF is the CDMA spread factor.

As presented in the graph 300, not the entire receiver dynamic range is useable. Many elements such as crest factor and the minimum signal-to-noise ratio (SNR) limit the useable receiver signal dynamic range. For a digitally modulated signal, the envelop of the signal varies with time, and the ratio between its peak and mean values is called the peak-to-mean ratio or the crest factor. The crest factor is a function of the traffic profile, which includes modulation, the number of channels, coding etc. The crest factor of a digitally modulated signal is characterized with a complementary cumulative distribution function (CCDF) curve. If a link quality requirement of the signal is known, the signal peak to mean CCDF curve can be used to determine the crest factor. For example, if the link quality requirement of the signal is 0.1%, the crest factor for the signal can be determined from the CCDF curve at 0.1%. The minimum SNR also reduces the useable receiver signal dynamic range. The minimum SNR is required to maintain signal quality. The SNR depends upon the traffic profile, such as a modulation type. For example, a quadrature-phase shift keying (QPSK) modulation requires an SNR of approximate 10 dB, while a 64-ary quadrature amplitude (QAM64) modulation requires an SNR of approximate 23 dB. Therefore, as shown in the graph 300, the useable receiver dynamic range is smaller than the receiver dynamic range.

The input signal has its own dynamic range. The signal dynamic range is defined as the difference in power between the total power of the received signal and the power of one channel. The signal dynamic range also depends upon the traffic profile. For example, a CDMA signal that contains 100 channels has a dynamic range of 20 dB, given by: 10*log 10(100)=20 dB. The signal dynamic range need is less than the receiver useable dynamic range. Thus, additional margins, such as the upper and lower margins (up_margin and low_margin in FIG. 3), are available for signal fluctuations and gain control system errors.

Figure 4:
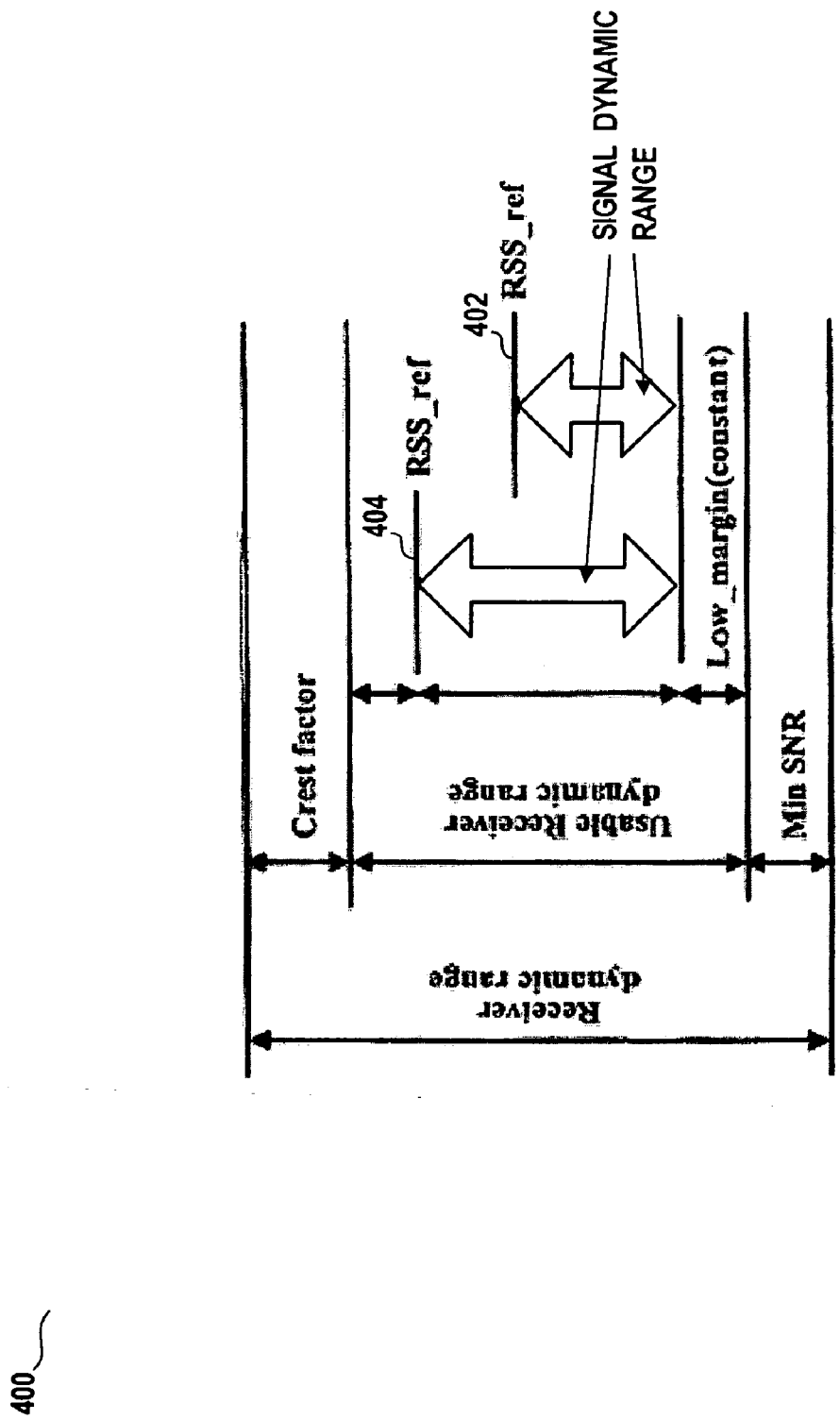
FIG. 4 presents a graph showing the dynamic ranges of the communications receiver and the input signal in accordance with another embodiment of the present invention.

The actual upper level boundary (up bound in FIG. 3) and lower level boundary (low bound in FIG. 3) of the received signal is determined by RSS_ref, which is used to set the input signal level to an optimal point, depending upon the receiver dynamic range and the traffic profile. For example, RSS_ref in FIG. 3 is set to an up bound level 302 for allowing the signal dynamic range to have an upper margin equivalent to the lower margin. An alternative method to set RSS_ref is shown in a graph 400 in FIG. 4, where the lower margin (low_margin) is set as a constant, while RSS_ref will vary (from a point 402 to a point 404), depending upon the signal dynamic range.

In a CDMA system, assume the number of channels is N_ch, the signal dynamic range is 10*log 10(N_ch). If the upper and lower margins are equal as required, RSS_ref is given as follows:

$$RSS\_ref=(DR\_rx-crest\_factor-SNR\_min)/2+SNR\_min+5*log\ 10(N\_ch)\ in\ dBm$$

Alternatively, if the lower margin (low_margin) is set as a constant, RSS_ref is given as follows:

$$RSS\_ref=SNR\_min+low\_margin+10*log\ 10(N\_ch)\ in\ dBm$$

where DR_rx is the receiver dynamic range in dB, crest_factor is the crest factor of the signal in dB, SNR_min is the minimum SNR required in dB, N_ch is the number of channels associated with this new traffic profile, and RSS_ref is given with respect to the effective noise floor of the receiver.

In the first case, if the calculated RSS_ave is less than RSS_ref, then the receiver gain should be increased by the calculated gain adjustment value. If the calculated RSS_ave is greater than RSS_ref, then the receiver gain should be decreased by the calculated gain adjustment value. The gain adjustment value ($\Delta G$) can be set such that it will be the gain difference corresponding to the difference of RSS_ref and RSS_ave according to the gain calibration table. Alternatively a fixed value such as 0.25 dB can be set as a gain tuning step for adjusting the receiver gain in steps until the full gain adjustment value ($\Delta G$) is reached.

In the second case, the traffic monitor 206 detects when and how the traffic profile will change. The traffic monitor 206 sends this information to the gain computing circuit 208 at an appropriate time. The gain computing circuit 208 then computes RSS_ave and the reference signal strength associated with the new traffic profile (RSS_ref1). If the upper and lower margins are equal as required, RSS_ref1 is given as follows:

$$RSS\_ref1=(DR\_rx-crest\_factor1-SNR\_min1)/2+SNR\_min1+5*log\ 10(N\_ch1)\ in\ dBm$$

Alternatively, if the lower margin (low_margin) is set as a constant, RSS_ref1 is given as follows:

$$RSS\_ref1=SNR\_min1+low\_margin+10*log\ 10(N\_ch1)\ in\ dBm$$

where DR_rx is the receiver dynamic range in dB. Crest_factor1 is the crest factor of the signal in dB, SNR_min1 is the minimum SNR required in dB, and N_ch1 is the number of channels, all are associated with this new traffic profile. RSS_ref1 is given with respect to the effective noise floor of the receiver.

The gain adjustment value ($\Delta G1$) can be calculated by:

$$\Delta G1 = \Delta G + \Delta TP$$

where $\Delta G$ is the gain delta resulting from the difference of RSS_ave and the current RSS_ref. $\Delta TP$ is the difference between RSS_ref1 and RSS_ref, resulting from the traffic profile change.

The gain computing circuit 208 will output the gain adjustment value ($\Delta G1$) at the coming gain updating cycle when the traffic profile changes as well. The gain setting, profile change, and all other system events are synchronized together with the system timing allowing for this proactive gain control implementation.

The receiver gain can be calculated and incorporated into the receiver in real time. This means that all functions such as RSS detection, traffic monitoring, gain adjustment computation, and gain setting can be carried out at the same time. In some cases, some of these functions may be carried out at a slower rate, such as to reduce the processor millions-of-instructions-per-second (MIPS) requirements.

The proactive gain control circuit 200 is proactive and digital. The ADC 222 converts the output signal from an analog format into a digital format, before the output signal is detected and monitored by the RSS detector 204 and the traffic monitor 206, respectively. This circuit 200 not only monitors the signal strength for gain changes due to environmental effects, but also monitors the traffic for information relating to future traffic profile changes. When no traffic profile change is detected, the circuit 200 will change the receiver gain settings to track signal changes resulting from environmental effects (typically slower gain changes). However, when a future traffic profile change is detected, the receiver gain will be changed accordingly to maintain the input signal level with the receiver's optimal useable dynamic range. This proactive gain control circuit 200 can prepare for the abrupt traffic profile changes, and will maintain an optimized operation for the communications receiver where the data communications traffic profile changes frequently.

Figure 5:
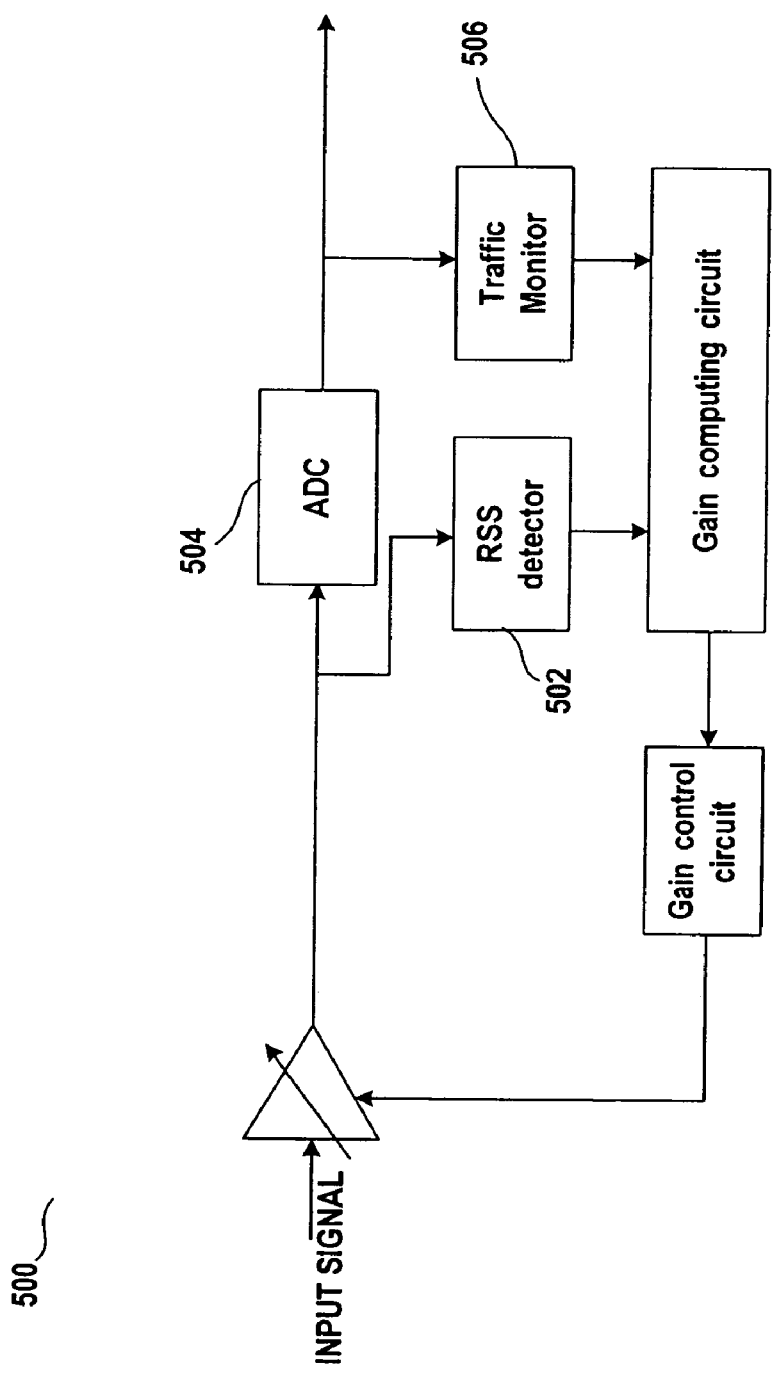
FIG. 5 presents a proactive gain control system in accordance with another embodiment of the present invention.

FIG. 5 presents a proactive gain control circuit 500 in accordance with another embodiment of the present invention. The circuit 500 is equivalent to the circuit 200, except that the RSS detector 502 detects the output signal in analog domain before the ADC converts the output signal from an analog format into a digital format.

The above illustration provides many different embodiments or embodiments for implementing different features of the invention. Specific embodiments of components and processes are described to help clarify the invention. These are, of course, merely embodiments and are not intended to limit the invention from that described in the claims. Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A proactive gain control system for a communications receiver, comprising:
   a variable gain module for outputting an output signal in response to an input signal;
   a detector for detecting the output signal and outputting a detection signal representing a signal strength of the output signal;

a traffic monitor for monitoring the output signal and outputting a traffic profile signal indicating that a traffic profile for the input signal will change;

a gain computing module for outputting a gain adjustment value in response to the detection signal and the traffic profile signal; and a gain control module for outputting a gain control signal to the variable gain module, which determines a gain between the input and output signals, in response to the gain adjustment value.

2. The proactive gain control system of claim 1 wherein the traffic profile includes information related to a modulation type of the input signal, a number of traffic channels for the input signal, a coding scheme of the input signal, a data transfer rate of the input signal, or a combination thereof.

3. The proactive gain control system of claim 1 wherein the traffic profile includes one or more instructions related to when and how a modulation type, a number of traffic channels, a coding scheme, or a data transfer rate will change.

4. The proactive gain control system of claim 1 wherein the gain adjustment value is determined by comparing a predetermined current reference signal strength with a average signal strength, which is a root mean square (RMS) value of the signal strength of the output signal over a predetermined window, when the traffic profile signal indicates that the traffic profile will not change in a coming gain updating cycle.

5. The proactive gain control system of claim 4 wherein the predetermined current reference signal strength is determined by a dynamic range of the receiver, a crest factor of the input signal, and a minimum signal-to-noise ration (SNR) required by the receiver.

6. The proactive gain control system of claim 5 wherein the gain control module increases the gain between the input and output signals in response to the gain adjustment value when the average signal strength is smaller than the predetermined current reference signal strength.

7. The proactive gain control system of claim 5 wherein the gain control module decreases the gain between the input and output signals in response to the gain adjustment value when the average signal strength is lager than the predetermined current reference signal strength.

8. The proactive gain control system of claim 1 wherein the gain computing module computes a prospective reference signal strength when the traffic profile signal indicates that the traffic profile will change in a coming gain updating cycle.

9. The proactive gain control system of claim 8 wherein the gain adjustment value is determined by comparing a predetermined current reference signal strength with a average signal strength, which is a root mean square (RMS) value of the signal strength of the output signal over a predetermined window, taking into account of a difference between the prospective reference signal strength and the predetermined current signal strength, when the traffic profile signal indicates that the traffic profile will change in a coming gain updating cycle.

10. The proactive gain control system of claim 9 wherein the predetermined current reference signal strength is determined by a dynamic range of the receiver, a crest factor of the input signal, and a minimum signal-to-noise ration (SNR) required by the receiver.

11. A proactive gain control system for a communications receiver, comprising:

a variable gain module for outputting an output signal in response to an input signal;

a detector for detecting the output signal and outputting a detection signal representing a signal strength of the output signal;

a traffic monitor for monitoring the output signal and outputting a traffic profile signal indicating that a traffic profile for the input signal will change;

a gain computing module for outputting a gain adjustment value in response to the detection signal and the traffic profile signal;

a gain control module for outputting a gain control signal to the variable gain module, which determines a gain between the input and output signals, in response to the gain adjustment value; and an analog-to-digital converter for converting the output signal from an analog format into a digital format, before the output signal is detected and monitored by the detector and the traffic monitor, respectively.

12. The proactive gain control system of claim 11 wherein the gain adjustment value is determined by comparing a predetermined current reference signal strength with a average signal strength, which is a root mean square (RMS) value of the signal strength of the output signal over a predetermined window, when the traffic profile signal indicates that the traffic profile will not change in a coming gain updating cycle.

13. The proactive gain control system of claim 12 wherein the predetermined current reference signal strength is determined by a dynamic range of the receiver, a crest factor of the input signal, and a minimum signal-to-noise ration (SNR) required by the receiver.

14. The proactive gain control system of claim 13, wherein the gain control module increases the gain between the input and output signals in response to the gain adjustment value when the average signal strength is smaller than the predetermined current reference signal strength.

15. The proactive gain control system of claim 13 wherein the gain control module decreases the gain between the input and output signals in response to the gain adjustment value when the average signal strength is lager than the predetermined current reference signal strength.

16. The proactive gain control system of claim 11 wherein the gain computing module computes a prospective reference signal strength when the traffic profile signal indicates that the traffic profile will change in a coming gain updating cycle.

17. The proactive gain control system of claim 16 wherein the gain adjustment value is determined by comparing a predetermined current reference signal strength with a average signal strength, which is a root mean square (RMS) value of the signal strength of the output signal over a predetermined window, taking into account of a difference between the prospective reference signal strength and the predetermined current signal strength, when the traffic profile signal indicates that the traffic profile will change in a coming gain updating cycle.

18. The proactive gain control system of claim 17 wherein the predetermined current reference signal strength is determined by a dynamic range of the receiver, a crest factor of the input signal, and a minimum signal-to-noise ration (SNR) required by the receiver.

19. A proactive gain control system for a communications receiver, comprising:

a variable gain module for outputting an output signal in response to an input signal;

a detector for detecting the output signal and outputting a detection signal representing a signal strength of the output signal;

a traffic monitor for monitoring the output signal and outputting a traffic profile signal indicating that a traffic profile for the input signal will change;

a gain computing module for outputting a gain adjustment value in response to the detection signal and the traffic profile signal;

a gain control module for outputting a gain control signal to the variable gain module, which determines a gain between the input and output signals, in response to the gain adjustment value; and an analog-to-digital converter for converting the output signal from an analog format into a digital format, after the output signal is detected by the detector, but before the output signal is monitored by the traffic monitor.

20. The proactive gain control system of claim 19 wherein the gain adjustment value is determined by comparing a predetermined current reference signal strength with a average signal strength, which is a root mean square (RMS) value of the signal strength of the output signal over a predetermined window, when the traffic profile signal indicates that the traffic profile will not change in a coming gain updating cycle.

21. The proactive gain control system of claim 20 wherein the predetermined current reference signal strength is determined by a dynamic range of the receiver, a crest factor of the input signal, and a minimum signal-to-noise ration (SNR) required by the receiver.

22. The proactive gain control system of claim 21 wherein the gain control module increases the gain between the input and output signals in response to the gain adjustment value when the average signal strength is smaller than the predetermined current reference signal strength.

23. The proactive gain control system of claim 21 wherein the gain control module decreases the gain between the input and output signals in response to the gain adjustment value when the average signal strength is lager than the predetermined current reference signal strength.

24. The proactive gain control system of claim 19 wherein the gain computing module computes a prospective reference signal strength when the traffic profile signal indicates that the traffic profile will change in a coming gain updating cycle.

25. The proactive gain control system of claim 24 wherein the gain adjustment value is determined by comparing a predetermined current reference signal strength with a average signal strength, which is a root mean square (RMS) value of the signal strength of the output signal over a predetermined window, taking into account of a difference between the prospective reference signal strength and the predetermined current signal strength, when the traffic profile signal indicates that the traffic profile will change in a coming gain updating cycle.

26. The proactive gain control system of claim 25 wherein the predetermined current reference signal strength is determined by a dynamic range of the receiver, a crest factor of the input signal, and a minimum signal-to-noise ration (SNR) required by the receiver.

* * * * *